United States Patent
Kimura

(10) Patent No.: US 10,276,242 B2
(45) Date of Patent: Apr. 30, 2019

(54) SEMICONDUCTOR MEMORY DEVICE

(71) Applicant: Toshiba Memory Corporation, Minato-ku (JP)

(72) Inventor: Keita Kimura, Fujisawa (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/885,076

(22) Filed: Jan. 31, 2018

(65) Prior Publication Data

US 2018/0218774 A1 Aug. 2, 2018

(30) Foreign Application Priority Data

Jan. 31, 2017 (JP) .................. 2017-015442

(51) Int. Cl.
| | |
|---|---|
| *G11C 16/08* | (2006.01) |
| *G11C 16/14* | (2006.01) |
| *G11C 11/4097* | (2006.01) |
| *G11C 11/408* | (2006.01) |
| *H01L 29/66* | (2006.01) |
| *H01L 21/768* | (2006.01) |
| *G11C 16/10* | (2006.01) |
| *G11C 16/04* | (2006.01) |
| *G11C 16/28* | (2006.01) |
| *G11C 16/32* | (2006.01) |

(52) U.S. Cl.
CPC .......... *G11C 16/08* (2013.01); *G11C 11/4085* (2013.01); *G11C 11/4087* (2013.01); *G11C 11/4097* (2013.01); *G11C 16/10* (2013.01); *G11C 16/14* (2013.01); *H01L 21/76897* (2013.01); *H01L 29/66545* (2013.01); *G11C 16/0466* (2013.01); *G11C 16/0483* (2013.01); *G11C 16/28* (2013.01); *G11C 16/32* (2013.01)

(58) Field of Classification Search
CPC ..... G11C 16/08; G11C 11/4087; G11C 16/28; G11C 16/0466; G11C 11/4085; G11C 11/4097; G11C 16/14
See application file for complete search history.

(56) References Cited

U.S. PATENT DOCUMENTS

2005/0057966 A1 3/2005 Nazarian
2008/0198668 A1 8/2008 Ueno
(Continued)

FOREIGN PATENT DOCUMENTS

JP 2008-300019 12/2008
JP 2009-266946 11/2009
(Continued)

*Primary Examiner* — Mohammed A Bashar
(74) *Attorney, Agent, or Firm* — Oblon, McClelland, Maier & Neustadt, L.L.P.

(57) ABSTRACT

A semiconductor memory device according to an embodiment includes a first memory cell transistor and a second memory cell transistor, a select transistor, a bit line, a first word line and a second word line, a select gate line, and a controller. During the program operation in the write operation with the first word line selected, the controller applies a first voltage to the select gate line and a second voltage lower than the first voltage to the first word line before applying the program pulse to the first word line, and applies a third voltage lower than the first voltage and higher than the second voltage to the select gate line while applying the program pulse to the first word line.

20 Claims, 12 Drawing Sheets

(56) References Cited

U.S. PATENT DOCUMENTS

| | | | |
|---|---|---|---|
| 2008/0304324 A1 | 12/2008 | Nagashima et al. | |
| 2009/0267128 A1 | 10/2009 | Maejima | |
| 2009/0268522 A1 | 10/2009 | Maejima | |
| 2009/0268523 A1 | 10/2009 | Maejima | |
| 2010/0207195 A1 | 8/2010 | Fukuzumi et al. | |
| 2011/0019486 A1 | 1/2011 | Jang et al. | |
| 2011/0284946 A1 | 11/2011 | Kiyotoshi | |
| 2013/0007353 A1* | 1/2013 | Shim | G11C 16/10 711/103 |
| 2015/0262682 A1* | 9/2015 | Futatsuyama | G11C 16/10 365/185.22 |

FOREIGN PATENT DOCUMENTS

| | | |
|---|---|---|
| JP | 4417383 | 2/2010 |
| JP | 4939971 | 5/2012 |
| JP | 5599049 | 10/2014 |

* cited by examiner

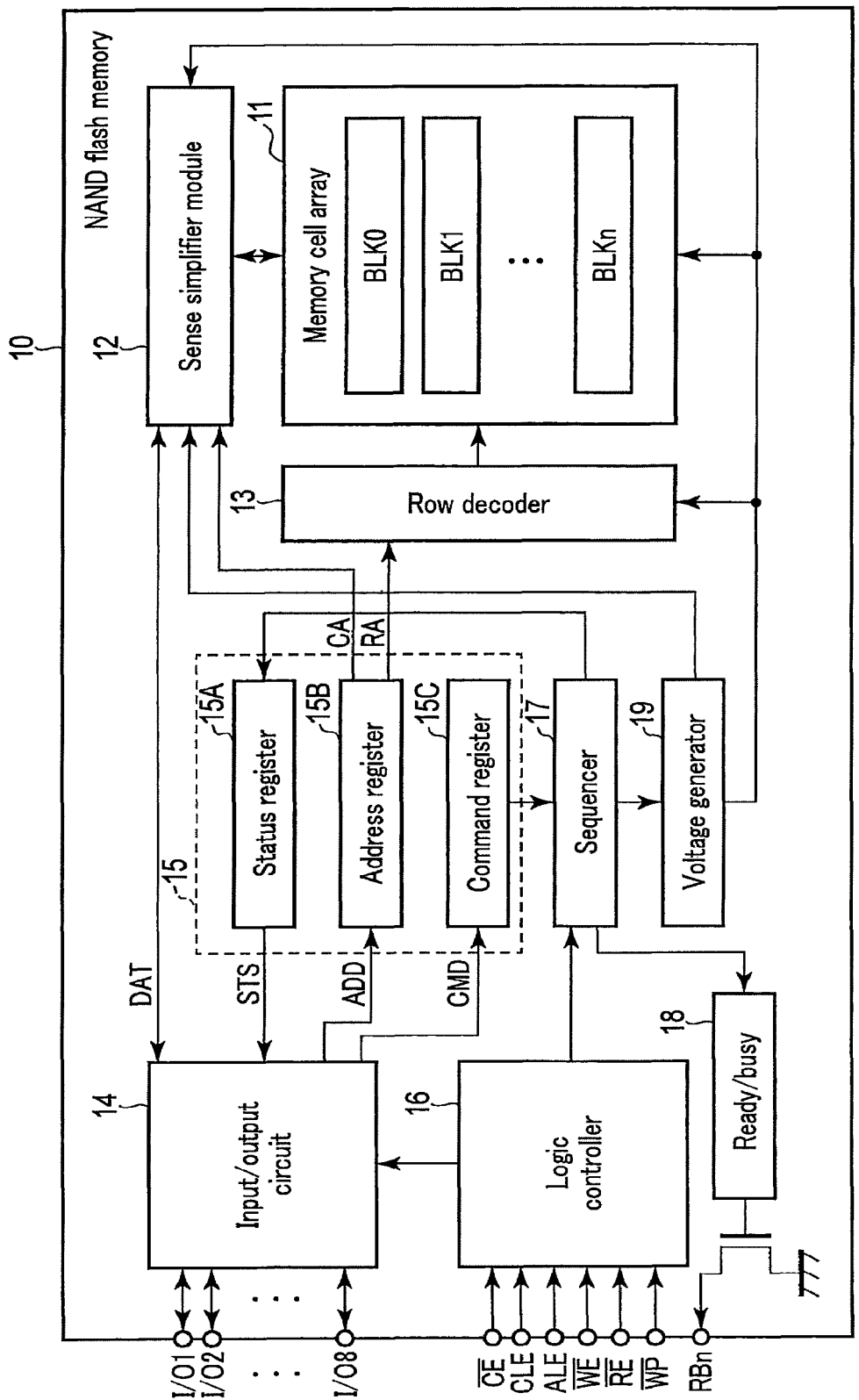
F I G. 1

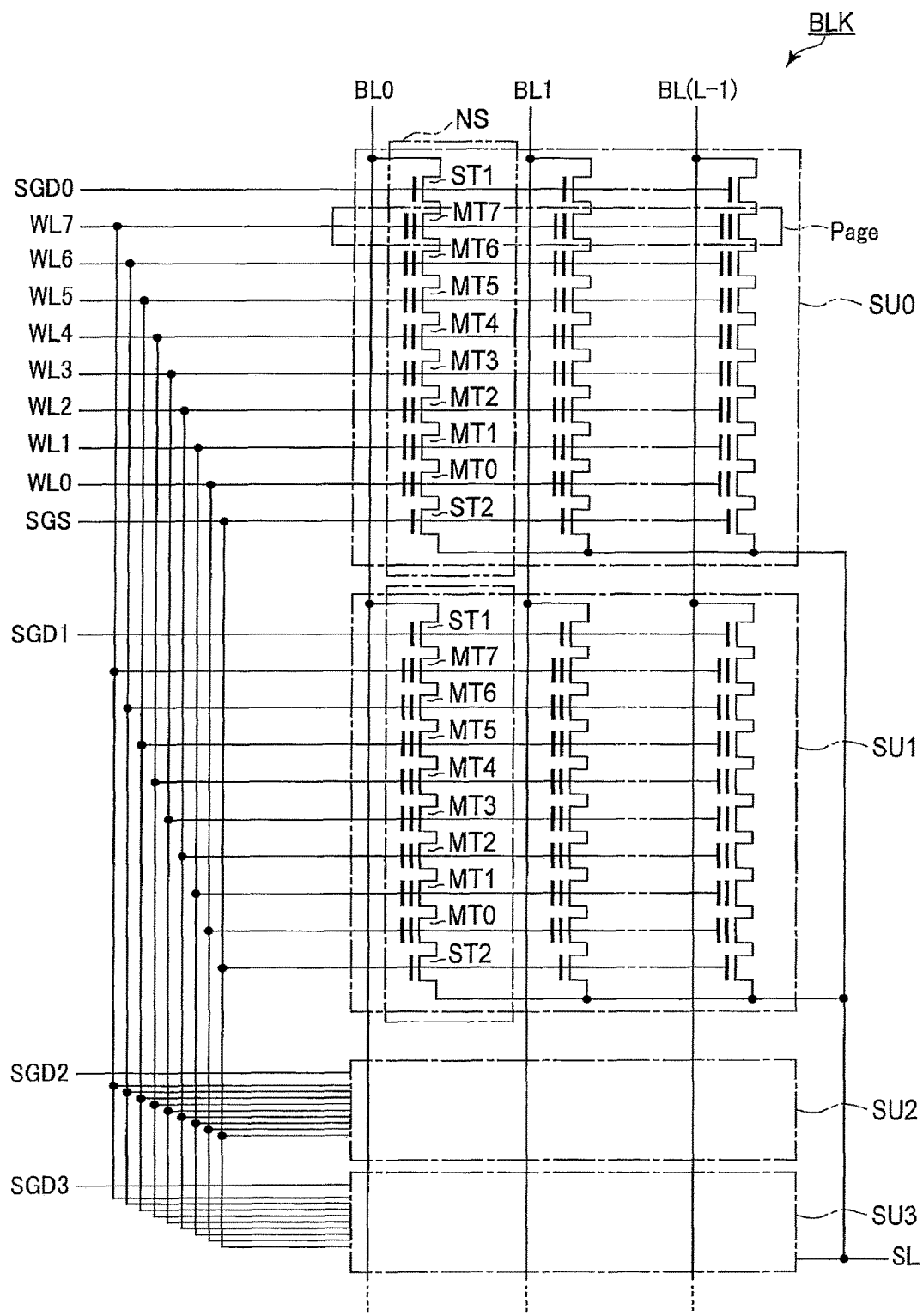
F I G. 2

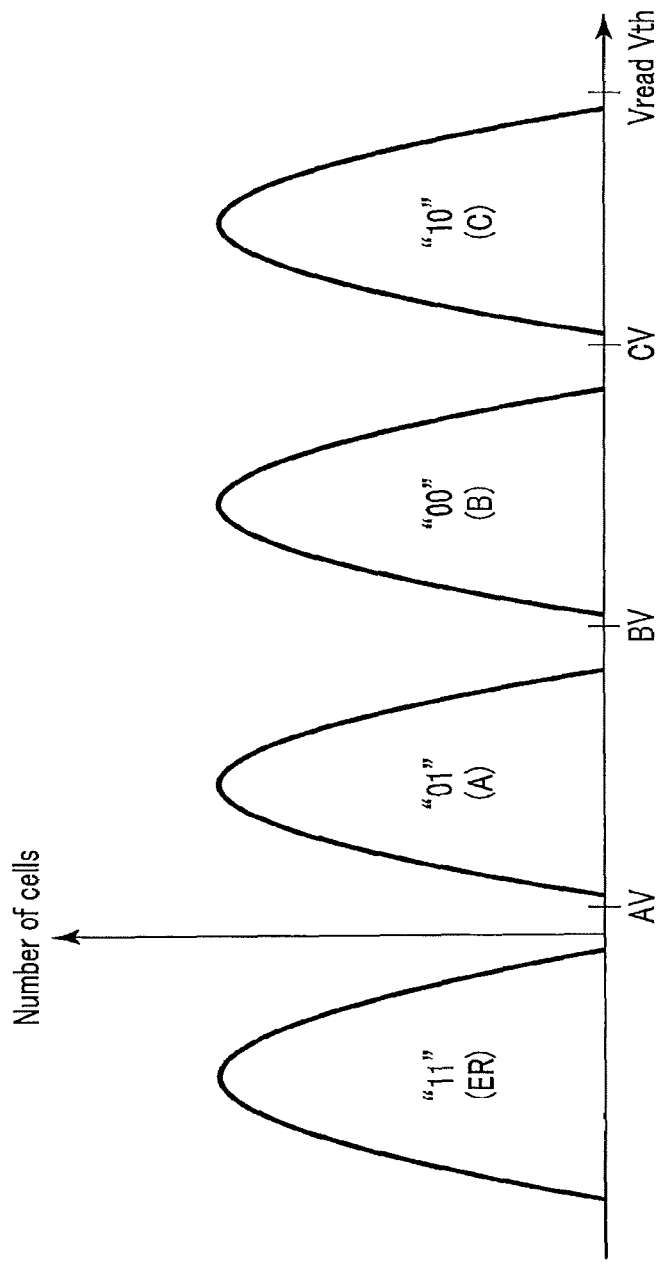
F I G. 3

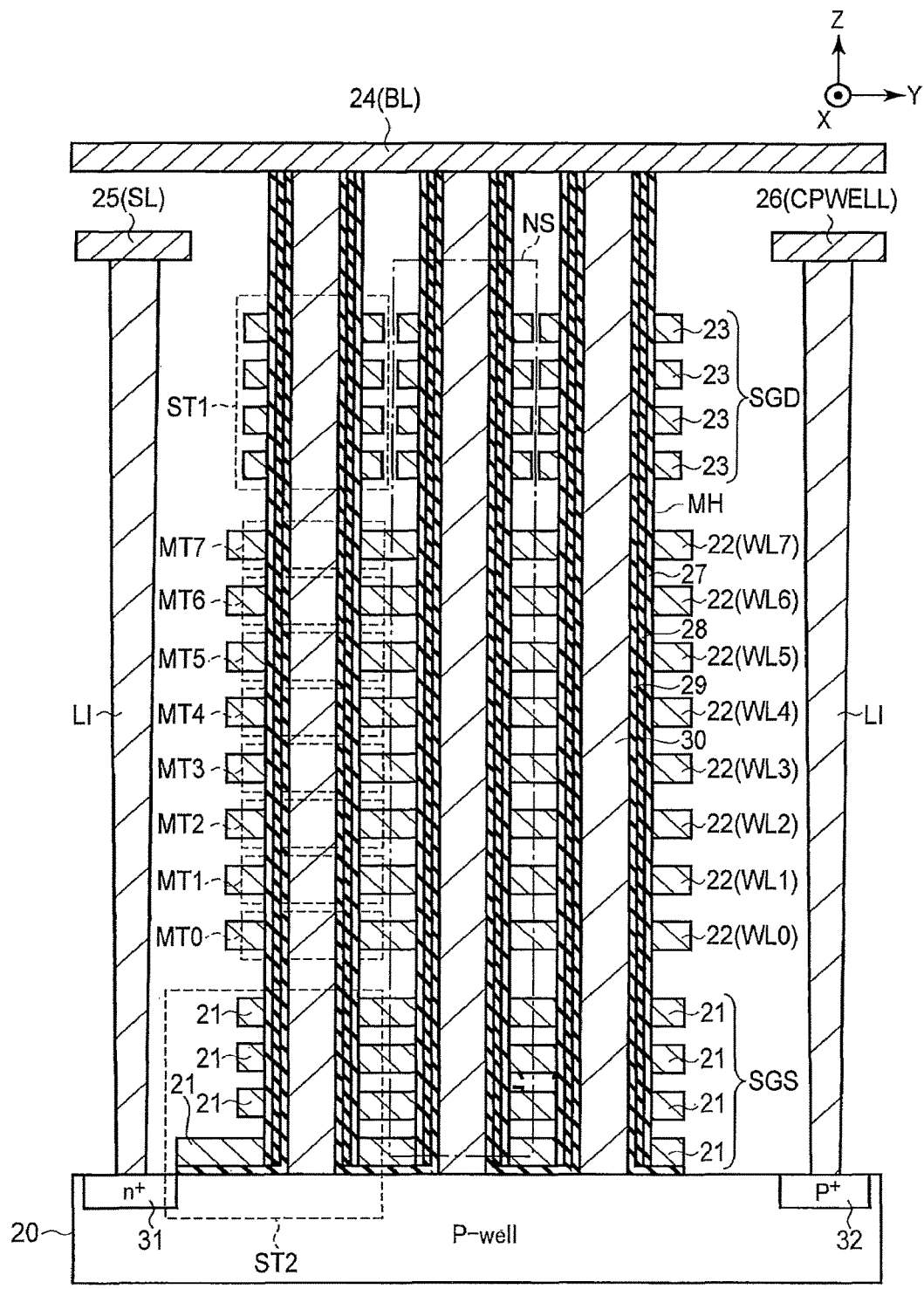
F I G. 4

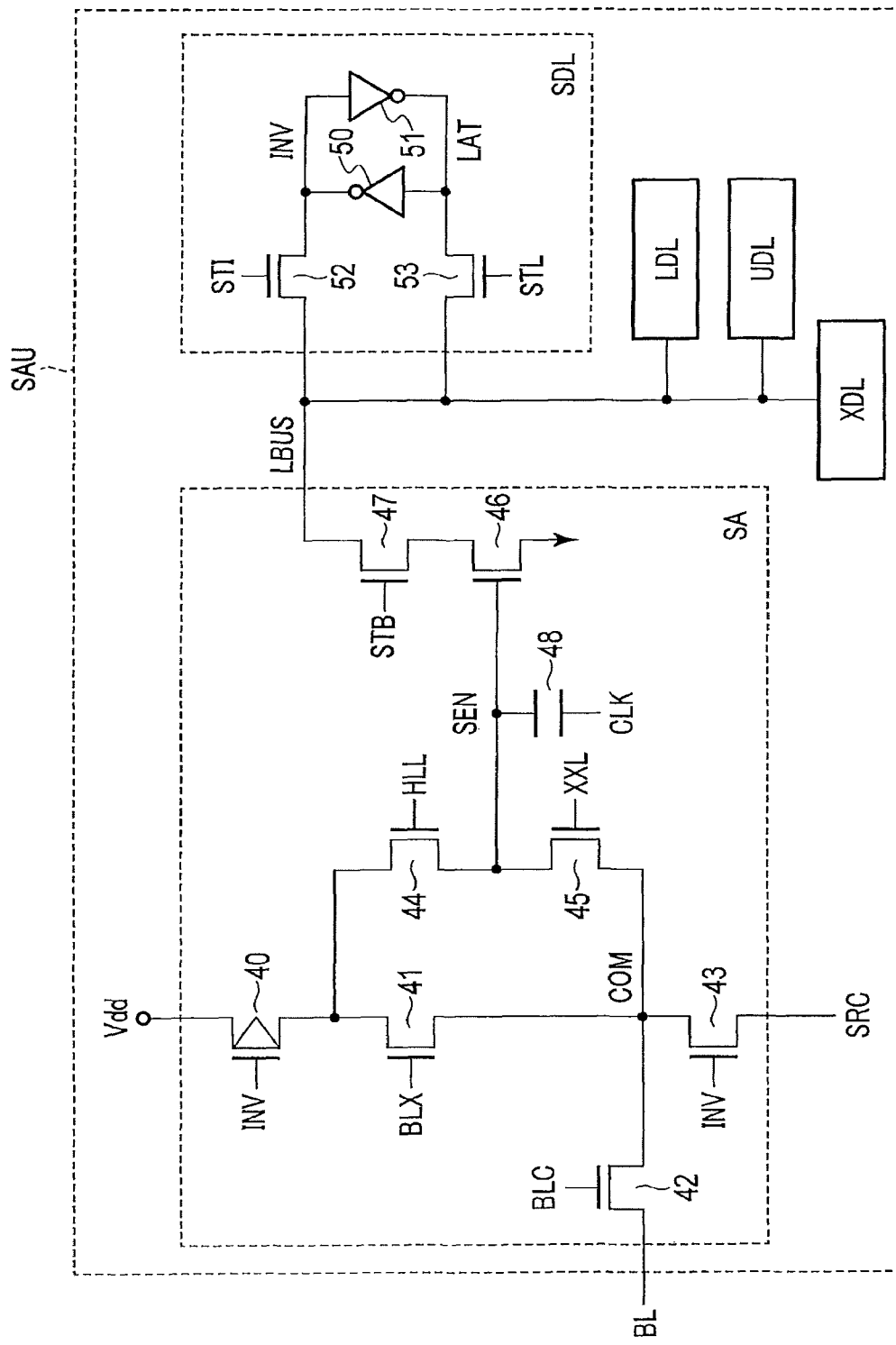
F I G. 5

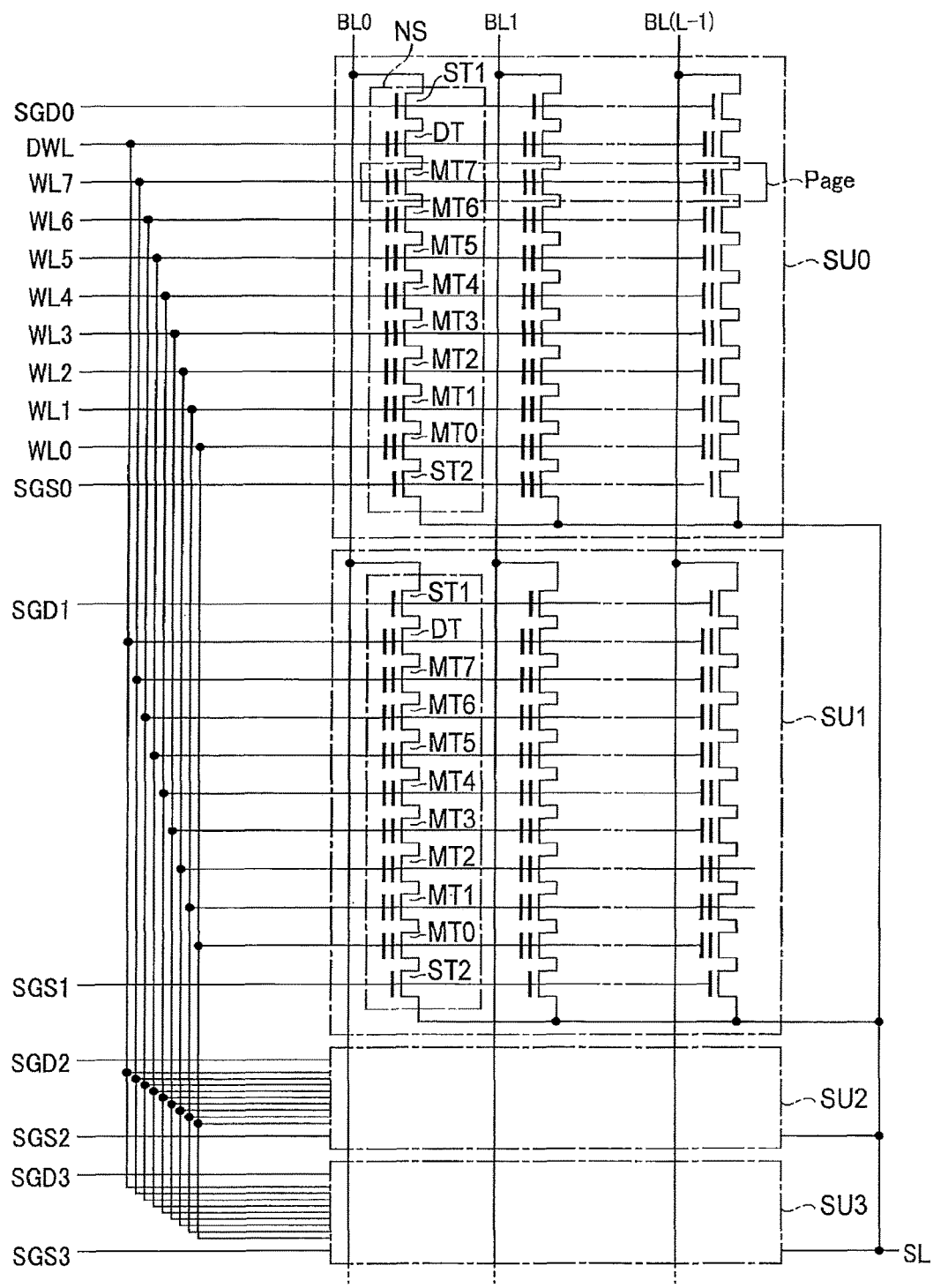
F I G. 9

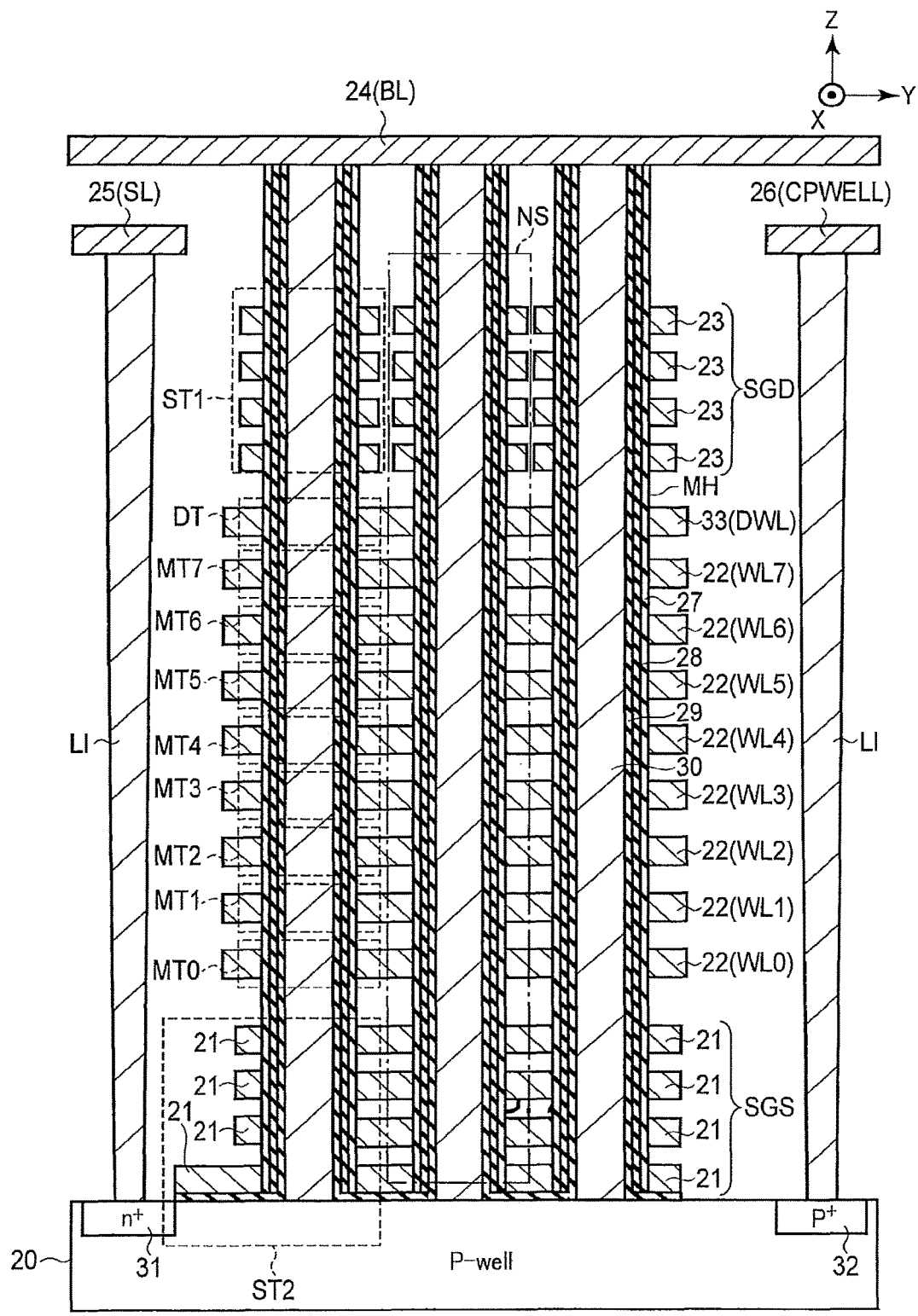
F I G. 10

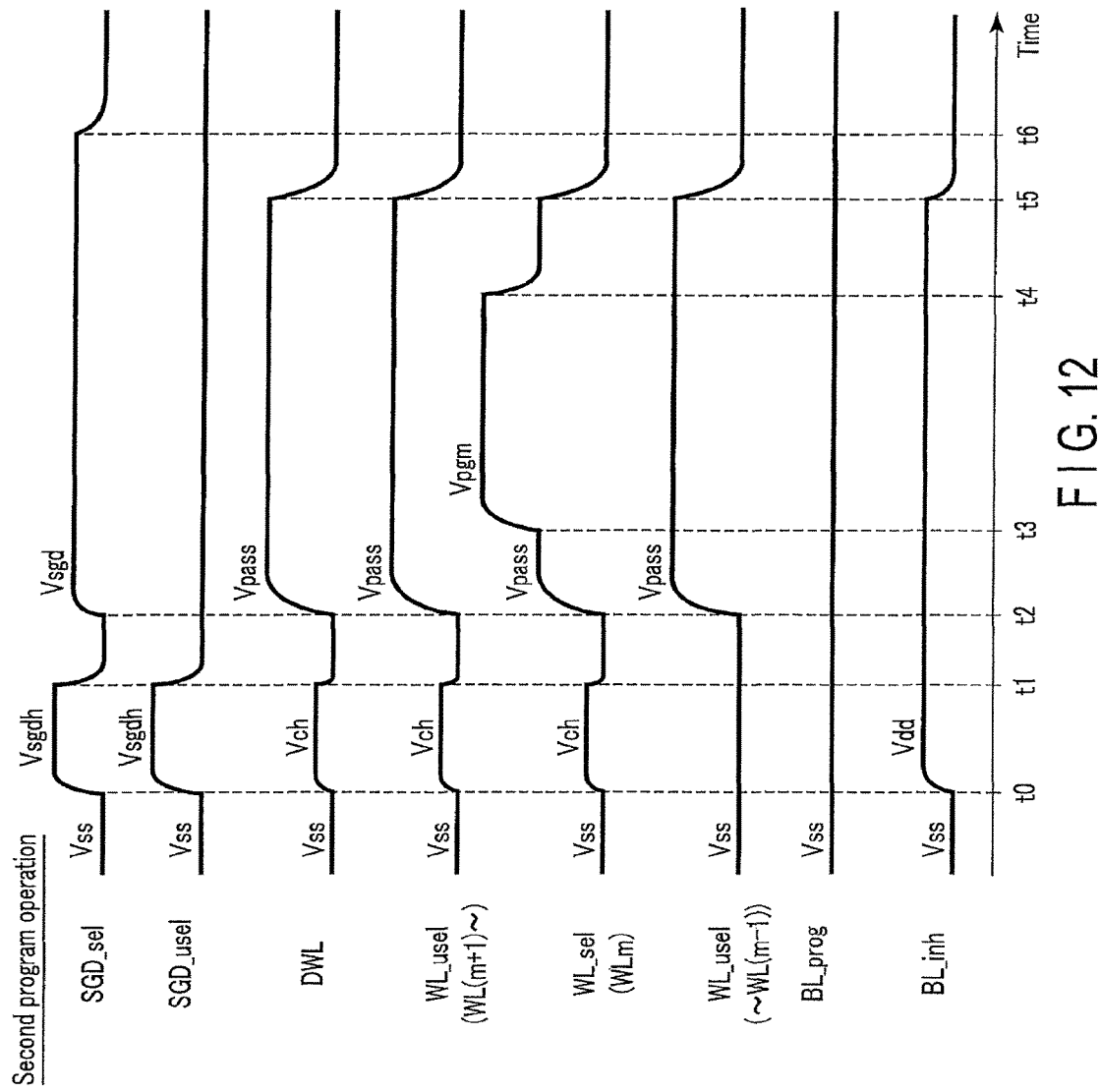
F I G. 12

SEMICONDUCTOR MEMORY DEVICE

CROSS-REFERENCE TO RELATED APPLICATIONS

This application is based upon and claims the benefit of priority from Japanese Patent Application No. 2017-015442, filed Jan. 31, 2017, the entire contents of which are incorporated herein by reference.

FIELD

Embodiments described herein relate generally to a semiconductor memory device.

BACKGROUND

A NAND type flash memory as a semiconductor memory device is known.

BRIEF DESCRIPTION OF THE DRAWINGS

FIG. 1 is a block diagram of a semiconductor memory device according to a first embodiment;

FIG. 2 is a circuit diagram of a memory cell array provided in the semiconductor memory device according to the first embodiment;

FIG. 3 is a diagram illustrating a threshold distribution of memory cells provided in the semiconductor memory device according to the first embodiment;

FIG. 4 is a cross-sectional view of the memory cell array provided in the semiconductor memory device according to the first embodiment;

FIG. 5 is a circuit diagram of a sense amplifier module provided in the semiconductor memory device according to the first embodiment;

FIG. 9 is a circuit diagram of a memory cell array according to a semiconductor memory device according to a second embodiment;

FIG. 10 is a cross-sectional view of the memory cell array provided in the semiconductor memory device according to the second embodiment;

FIG. 12 is a waveform diagram of the write operation in the semiconductor memory device according to the second embodiment.

DETAILED DESCRIPTION

Figure 6:
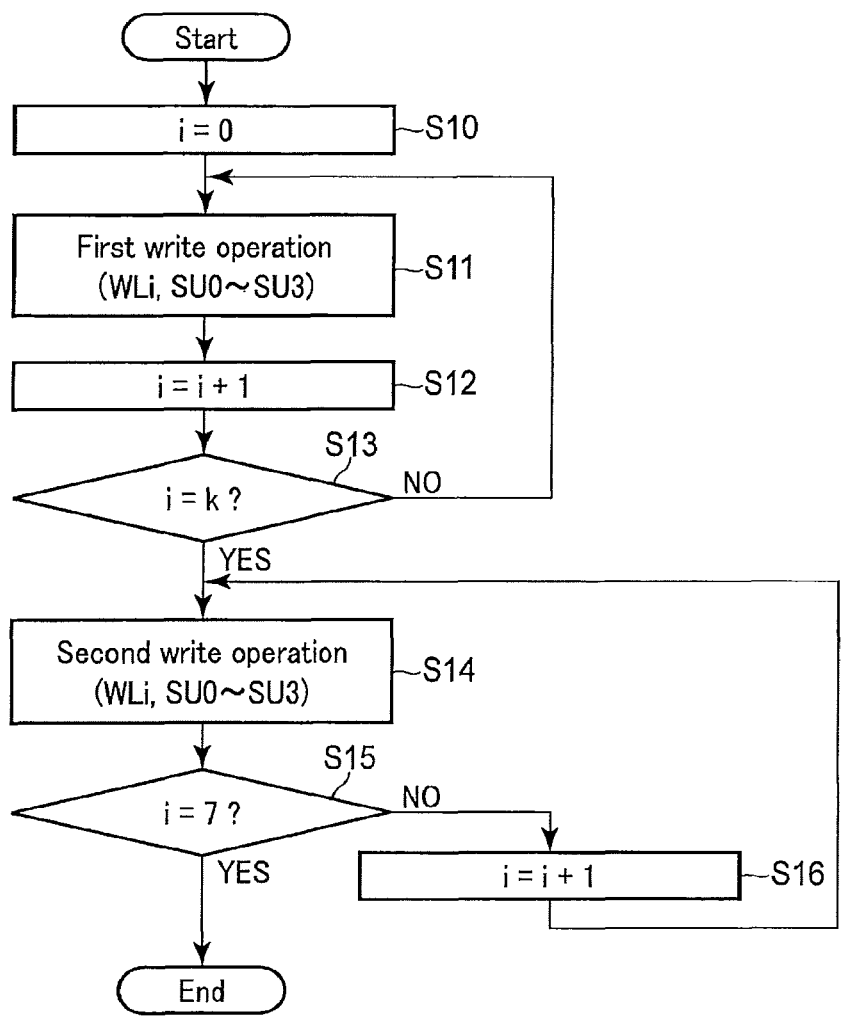
FIG. 6 is a flowchart of a write operation in the semiconductor memory device according to the first embodiment.

A semiconductor memory device according to an embodiment includes a first memory cell transistor and a second memory cell transistor, a select transistor, a bit line, a first word line and a second word line, a select gate line, and a controller. A first end of a first memory cell is connected to a first end of the second memory cell transistor. A second end of the second memory cell transistor is connected to a first end of the select transistor. A second end of the select transistor is connected to the bit line. The first and second word lines are connected to gates of the first and second memory cell transistors, respectively. The select gate line is connected to a gate of the select transistor. The controller performs a write operation. In the write operation, the controller performs a program loop including a program operation of applying a program pulse to a selected word line. During the program operation in the write operation with the first word line selected, the controller applies a first voltage to the select gate line and a second voltage lower than the first voltage to the first word line before applying the program pulse to the first word line, and applies a third voltage lower than the first voltage and higher than the second voltage to the select gate line while applying the program pulse to the first word line. During the program operation in the write operation with the second word line selected, the controller applies the first voltage to the select gate line and a fourth voltage higher than the second voltage to the second word line before applying the program pulse to the second word line, and applies the third voltage to the select gate line while applying the program pulse to the second word line.

Hereinafter, embodiments will be described with reference to the drawings. The drawings are schematic. In the following description, the same reference signs denote constituent elements having substantially the same functions and configurations. Numeric characters after the letters constituting a reference sign, letters after the numeric characters constituting a reference sign, and "under bar+letters" attached to the letters constituting a reference sign are referenced by reference signs containing the same letters, and are used to distinguish components having a similar configuration. When the components denoted by the reference signs containing the same letters do not need to be distinguished from each other, the components are referred to by the reference signs containing only the same letters or numeric characters.

[1] First Embodiment

A semiconductor memory device according to a first embodiment will be described below.

[1-1] Configuration

[1-1-1] Configuration of the Semiconductor Memory Device 10

First, a configuration of the semiconductor memory device 10 will be described using FIG. 1. FIG. 1 illustrates a block diagram of the semiconductor memory device 10. The semiconductor memory device 10 is a NAND flash memory configured to store data in a nonvolatile manner. As illustrated in FIG. 1, the semiconductor memory device 10 includes a memory cell array 11, a sense amplifier module 12, a row decoder 13, an input/output circuit 14, a register 15, a logic controller 16, a sequencer 17, a ready/busy controller 18, and a voltage generator 19.

The memory cell array 11 includes blocks BLK0 to BLKn (n is a natural number of 1 or larger). The block BLK is a set of a plurality of nonvolatile memory cells associated with bit lines and word lines, and for example, serves as a data erase unit. The semiconductor memory device 10 can hold data utilizing a multi-level cell (MLC) method of storing data of two or more bits in each memory cell. The present embodiment will be described taking, as an example, a case where 2-bit data is stored in the memory cell.

The sense amplifier module 12 outputs data DAT read from the memory cell array 11 to an external controller via the input/output circuit 14. The sense amplifier module 12 also transfers write data DAT received from the external controller via the input/output circuit 14 to the memory cell array 11.

The row decoder 13 selects the word line corresponding to the memory cell on which a read operation or a write operation is to be performed. The row decoder 13 applies different desired voltages to the selected word line and to each unselected word line.

The input/output circuit 14 transmits and receives input/output signals I/O each with an 8-bit width (I/O1 to I/O8) to and from the external controller. For example, the input/output circuit 14 transfers the write data DAT included in the input/output signal I/O received from the external controller, to the sense amplifier module 12. The input/output circuit 14 also transmits read data DAT transferred from the sense amplifier module 12 to the external controller as the input/output signal I/O.

The register 15 includes a status register 15A, an address register 15B, and a command register 15C. The status register 15A holds status information STS. The status information STS includes information indicative of an operating state of the sequencer 17. The address register 15B receives address information ADD from the input/output circuit 14 and holds the address information ADD. The address register 15B transfers a column address signal CA and a row address signal RA included in the address information ADD to the sense amplifier module 12 and the row decoder 13, respectively. The command register 15C receives commands CMD from the input/output circuit 14 and holds the commands CMD. Based on the commands CMD held in the command register 15C, the sequencer 17 performs various operations.

The logic controller 16 receives various control signals from the external controller to control the input/output circuit 14 and the sequencer 17. The control signals include, for example, a chip enable signal /CE, a command latch enable signal CLE, an address latch enable signal ALE, a write enable signal /WE, a read enable /RE, and a write protect signal /WP. The signal /CE is a signal for enabling the semiconductor memory device 10. The signal CLE is a signal notifying the input/output circuit 14 that a signal input to the semiconductor memory device 10 in parallel with the asserted signal CLE is the command CMD. The signal ALE is a signal notifying the input/output circuit 14 that a signal input to the semiconductor memory device 10 in parallel with the asserted signal ALE is the address information ADD. The signals /WE and /RE are signals indicating, for example, input and output of the input/output signals I/O1 to I/O8, respectively, to the input/output circuit 14. The signal /WP is a signal setting the semiconductor memory device 10 to a protect state, for example, upon power-on and power-off.

The sequencer 17 controls operations of the semiconductor memory device 10 as a whole. Specifically, the sequencer 17 controls the sense amplifier module 12, the row decoder 13, the voltage generator 19, and the like based on the commands CMD transferred from the command register 15C to perform a data write operation, a data read operation, and the like. The sequencer 17 also includes a counter not illustrated in the drawings. The counter is used during the write operation to count the number of times a program loop described below has been repeated.

The ready/busy control circuit 18 generates a ready/busy signal RBn based on the operating state of the sequencer 17 and transmits the signal RBn to the external controller. The signal RBn is a signal notifying the external controller whether the semiconductor memory device 10 is in a ready state where the semiconductor memory device 10 accepts instructions from the external controller or in a busy state where the semiconductor memory device 10 accepts no instructions from the external controller.

The voltage generator 19 generates desired voltages based on indications from the sequencer 17. The voltage generator 19 supplies the resultant voltages to the memory cell array 11, the sense amplifier module 12, and the row decoder 13.

[1-1-2] Configuration of the Memory Cell Array 11

Now, a configuration of the memory cell array 11 will be described using FIG. 2. FIG. 2 is a circuit diagram of the memory cell array 11 illustrating a detailed circuit configuration for one block BLK in the memory cell array 11. As illustrated in FIG. 2, the block BLK comprises, for example, string units SU0 to SU3.

Each of the string units SU includes a plurality of NAND strings NS. The NAND strings NS are provided in association with bit lines BL0 to BL(L−1) ((L−1) is a natural number of 1 or larger). The NAND string NS includes, for example, eight memory cell transistors MT (MT0 to MT7) and select transistors ST1 and ST2. The number of the memory cell transistors MT included in one NAND string NS is not limited to eight and may be optional.

The memory cell transistor MT includes a control gate and a charge storage layer to hold data in a nonvolatile manner. The memory cell transistors MT0 to MT7 are connected together in series between a source of the select transistor ST1 and a drain of the select transistor ST2. Control gates of the memory cell transistors MT0 to MT7 in the same block are connected commonly to the word line WL0 to WL7, respectively; the control gates of the memory cell transistors MT0 in the same block are connected commonly to the word line WL0.

Gates of the select transistors ST1 in each of the string units SU0 to SU3 are connected commonly to a corresponding one of select gate lines SGD0 to SGD3. Drains of the select transistors ST1 in the same column in the same block BLK are connected commonly to the corresponding bit line. Moreover, the drains of the select transistors ST1 in the same column are connected together among a plurality of the blocks BLK. Gates of the select transistors ST2 in the same block are connected commonly to a select gate line SGS. Source of the select transistors ST2 in the same block are connected commonly to a source line SL. Moreover, the sources of the select transistors ST2 are connected together among a plurality of blocks BLK.

In the above-described configuration, a set of 1-bit data held by a plurality of the memory cell transistors MT connected to the common word line WL is referred to as a "page". Therefore, when 2-bit data is stored in one memory cell transistor MT, two pages of data are stored in a set of a plurality of memory cells connected to one word line WL.

A threshold distribution of the memory cell transistors MT described above is, for example, as illustrated in FIG. 3. FIG. 3 illustrates the threshold distribution of the memory cell transistors MT each holding 2-bit data, and voltages used for verification. An axis of ordinate corresponds to the number of memory cell transistors MT, and an axis of abscissas corresponds to a threshold voltage Vth.

When each of the memory cell transistors MT holds 2-bit data, the distribution of the threshold voltage is divided into four portions as illustrated in FIG. 3. The four threshold distributions are referred to as an "ER"-level, an "A"-level, a "B"-level, and a "C"-level in order of increasing threshold voltage. The "ER"-level is distributed, for example, at and below a voltage Vss corresponding to a ground voltage. For example, "11" data, "01" data, "00" data, and "10" data are assigned to the threshold distributions of the "ER"-level, the "A"-level, the "B"-level, and the "C"-level, respectively. The assignment of the data to the threshold distributions is not limited to this, and may be variously modified.

Verify voltages AV, BV, and CV illustrated in FIG. 3 are used for verification for the "A"-level, the "B"-level, and the "C"-level, respectively, during the write operation. A read voltage Vread is a voltage at which the memory cell transistor MT with the read voltage Vread applied thereto is turned on regardless of the data held by the memory cell transistor MT. The relationship among the voltage values is AV<BV<CV<Vread.

Threshold voltages of the memory cell transistors MT holding the "11" data are lower than the voltage AV and corresponds to a data erase state. Threshold voltage of the memory cell transistors MT holding the "01" data are equal to or higher than the voltage AV and lower than the voltage BV. Threshold voltage of the memory cell transistors MT holding the "00" data are equal to or higher than the voltage BV and lower than the voltage CV. Threshold voltage of the memory cell transistors MT holding the "10" data are equal to or higher than the voltage CV.

Write and read of data may be performed for each page or for each word line WL. During the read operation, in which level the threshold voltage of the read target memory cell transistor MT is included is determined. Various read voltages are specified for this determination. A voltage used to determine whether one memory cell transistor MT has a threshold voltage in the "ER"-level or a threshold voltage in or above the "A"-level is set between a higher-side tail of the "ER"-level and a lower-side tail of the "A"-level. A voltage used to determine whether one memory cell transistor MT has a threshold voltage in or below the "A"-level or a threshold voltage in or above the "B"-level is set between a higher-side tail of the "A"-level and a lower-side tail of the "B"-level. A voltage used to determine whether one memory cell transistor MT has a threshold voltage in or below the "B"-level or a threshold voltage in the "C"-level is set between a higher-side tail of the "B"-level and a lower-side tail of the "C"-level.

Now, a cross-sectional structure of the memory cell array 11 will be described using FIG. 4. FIG. 4 illustrates a cross-sectional view of the memory cell array 11, and an X axis, a Y axis, and a Z axis intersecting one another. In FIG. 4, illustration of interlayer dielectrics is omitted. As illustrated in FIG. 4, the semiconductor memory device 10 includes a P-type well area 20, interconnect layers 21 to 26, a plurality of semiconductor pillars MH, and a plurality of contact plugs LI.

The P-type well area 20 is formed in a front surface of a semiconductor substrate. The interconnect layers 21 to 23 are stacked in order above the P-type well area 20. The interconnect layers 21 to 23 function as the select gate line SGS, the word lines WL, and the select gate line SGD, respectively. For example, the number of the interconnect layers 22 corresponds to the number of the word lines WL. In the example in FIG. 4, each of the select gate lines SGS and SGD includes four interconnect layers. In this manner, each of the select gate lines SGS and SGD may include a plurality of interconnect layers or one interconnect layer. Each of the interconnect layers 21 to 23 is formed like a plate spreading in an X direction and a Y direction.

The plurality of semiconductor pillars MH is formed to extend from a top surface of the set of the interconnect layers 23 to a top surface of the P-type well area 20. In other words, the semiconductor pillars MH are provided to extend through the interconnect layers 21 to 23 along a Z direction. A block insulating film 27, an insulating film (charge storage layer) 28, and a tunnel oxide film 29 are formed in order on each side surface of each of the semiconductor pillars MH. In each of the semiconductor pillars MH, a semiconductor material 30 including a conductive material is formed inside the tunnel oxide film 29. A portion of the semiconductor pillar MH inside the tunnel oxide film 29 may include a plurality of materials.

Interconnect layers 24 corresponding to the bit lines BL are formed above the interconnect layers 23 and the semiconductor pillars MH. The bit lines BL are connected to the corresponding semiconductor pillars MH. Contact plugs including a conductive material may be formed between the bit lines BL and the corresponding semiconductor pillars MH.

Interconnect layers 25 and 26 corresponding to the source line SL and a well line CPWELL are formed between the set of the interconnect layers 23 and the set of the interconnect layers 24. The interconnect layer 25 is connected via a contact plug LI to an $n^+$ impurity diffusion area 31 formed in the front surface of the well area 20. The interconnect layer 26 is connected via the contact plug LI to a $p^+$ impurity diffusion area 32 formed in the front surface of the well area 20. Each of the contact plugs LI is formed like a plate spreading in the X direction and the Z direction.

In the configuration described above, one semiconductor pillar MH corresponds to one NAND string NS. Specifically, an intersection point between the select gate line SGD and the semiconductor pillar MH and an intersection point between the select gate line SGS and the semiconductor pillar MH correspond to the select transistors ST1 and ST2, respectively. Similarly, an intersection point between each word line WL and each semiconductor pillar MH corresponds to the memory cell transistor MT.

Furthermore, a plurality of the above-described configurations is arrayed in the X direction. For example, one string unit SU includes a plurality of the NAND strings NS arrayed in the X direction. When a plurality of the string units SU is provided in the same block BLK, the interconnect layers 23 corresponding to the select gate line SGD are separated from one another in such a manner as to belong to the respective string units SU.

The lowermost interconnect layer 21 and the tunnel oxide film 29 are formed up to the vicinity of the $n^+$ impurity diffusion area 31. Consequently, when the select transistor ST2 is set to an on state, a current path is formed between the NAND string NS and the $n^+$ impurity diffusion area 31.

Alternatively, the memory cell array 11 may have another configuration. The configuration of the memory cell array 11 is described, for example, in U.S. patent application Ser. No. 12/407,403, filed on Mar. 19, 2009 and entitled "Three-dimensionally Stacked Nonvolatile Semiconductor Memory". The configuration of the memory cell array 11 is also described in U.S. patent application Ser. No. 12/406,524, filed on Mar. 18, 2009 and entitled "Three-dimensionally Stacked Nonvolatile Semiconductor Memory", U.S. patent application Ser. No. 12/679,991, filed on Mar. 25, 2010 and entitled "Nonvolatile Semiconductor Memory And Manufacturing Method For The Same", and U.S. patent application Ser. No. 12/532,030, filed on Mar. 23, 2009 and entitled "Semiconductor Memory And Manufacturing Method For The Same". These patent applications are incorporated herein by reference in their entirety.

[1-1-3] Configuration of the Sense Amplifier Module 12

Now, a configuration of the sense amplifier module 12 will be described. The sense amplifier module 12 includes a plurality of sense amplifier units SAU provided for the respective bit lines BL. FIG. 5 illustrates a circuit configuration of the sense amplifier unit SAU. As illustrated in FIG. 5, the sense amplifier unit SAU includes a sense amplifier SA and latch circuits SDL, LDL, UDL, and XDL. The sense amplifier SA and the latch circuits SDL, LDL, UDL, and XDL are connected together by a bus LBUS to allow data to be transmitted and received among these components.

During the read operation, the sense amplifier SA senses data read and retrieved onto the corresponding bit line to determine whether the read data is "0" or "1". During the write operation, the sense amplifier applies a voltage to the bit line BL based on write data. As illustrated in FIG. 5, the sense amplifier SA includes a p-channel MOS transistor 40, n-channel MOS transistors 41 to 47, and a capacitor 48.

The transistor 40 includes a first end connected to a power supply terminal and a gate connected a node INV. The transistor 41 includes a first end connected to a second end of the transistor 40, a second end connected to a node COM, and a gate to which a control signal BLX is input. The transistor 42 includes a first end connected to the node COM, a second end connected to the corresponding bit line BL, and a gate to which a control signal BLC is input. The transistor 43 includes a first end connected to the node COM, a second end connected to a node SRC, and a gate connected to the node INV. The transistor 44 includes a first end connected to a second end of the transistor 40, a second end connected to a node SEN, and a gate to which a control signal HLL is input. The transistor 45 includes a first end connected to the node SEN, a second end connected the node COM, and a gate to which a control signal XXL is input. The transistor 46 includes a first end connected to a ground terminal and a gate connected to the node SEN. The transistor 47 includes a first end to which a second end of the transistor 46 is connected, a second end connected to the bus LBUS, and a gate to which a control signal STB is input. The capacitor 48 includes a first end connected to the node SEN and a second end to which a clock CLK is input. For example, a voltage Vdd serving as a power-supply voltage for the semiconductor memory device 10 is applied to the power supply terminal connected to the first end of the transistor 40. Furthermore, for example, a voltage Vss serving as a ground voltage for the semiconductor memory device is applied to the node SRC.

The latch circuits SDL, LDL, and UDL temporarily hold the read data and the write data. The read data identified by the sense amplifier unit SAU during the read operation and the write data transferred to the latch circuit XDL during the write operation are transferred, for example, to any of the latch circuits SDL, LDL, and UDL. As illustrated in FIG. 5, the latch circuit SDL includes inverters 50 and 51 and n-channel MOS transistors 52 and 53.

The inverter 50 includes an input terminal connected to a node LAT and an output terminal connected to the node INV. The inverter 51 includes an input terminal connected to the node INV and an output terminal connected to the node LAT. The transistor 52 includes a first end connected to the node INV, a second end connected to the bus LBUS, and a gate to which a control signal STI is input. The transistor 53 includes a first end connected to the node LAT, a second end connected to the bus LBUS, and a gate to which a control signal STL is input. A circuit configuration of each of the latch circuits LDL and UDL is similar to the circuit configuration of the above-described latch circuit SDL, and thus, description thereof is omitted.

The latch circuit XDL is used for input and output of data between the sense amplifier unit SAU and the input/output circuit 14. In other words, data received from the input/output circuit 14 is transferred to the latch circuit SDL, LDL, or UDL, or to the sense amplifier SA via the latch circuit XDL. Data from the latch circuit SDL, LDL, or UDL, or the sense amplifier SA is transferred to the input/output circuit 14 via the latch circuit XDL.

In the above-described configuration of the sense amplifier unit SAU, the various control signals are generated, for example, by the sequencer 17. In the read operation, a timing when the sense amplifier SA identifies the read data is based on a timing when the signal STB is asserted. In various operations, the transistor 42 clamps the voltage of the bit line BL based on the signal BLC.

The configuration of the sense amplifier module 12 is not limited to the above-described one and may be variously modified. For example, the number of the latch circuits provided in the sense amplifier unit SAU is not limited to the value described above but is designed based on the number of bits held by one memory cell transistor MT.

[1-2] Write Operation of the Semiconductor Memory Device 10

Now, the write operation of the semiconductor memory device 100 will be described in brief. In the write operation, the row decoder 13 selects each of the block BLK, the string unit SU, and the word line WL based on the address information received from the external controller. Then, the sequencer 17 repeatedly performs a program loop including a combination of a program operation and a verify operation by incrementing a program voltage Vpgm.

The program operation is an operation of applying the program voltage Vpgm to the selected word line WL to increase the threshold voltage of the write target memory cell. In the program operation, a precharge operation is performed before the program voltage is applied. The precharge operation is an operation of charging the bit line BL corresponding to write inhibited memory cells to increase a channel potential of the corresponding NAND string NS. For the write inhibited memory cells, variation in the threshold voltage is suppressed by the precharge operation and a self-boost technique used during application of the program voltage.

The verify operation is an operation of determining whether the threshold voltage of the memory cell is equal to or higher than the desired threshold voltage. The sequencer 17 does not perform verify reading on the memory cells having passed the verification, during subsequent verify operations.

The semiconductor memory device 10 according to the present embodiment changes, for each block BLK, the program operation performed during the write operation before selection of the particular word line WL in such a manner that a different program operation is performed during the write operation after the selection of the particular word line WL. Specifically, for each block BLK, the sequencer 17 performs a first program operation during a first write operation before the selection of the particular word line WL and performs a second program operation during a second write operation after the selection of the particular word line WL. The first program operation is different from the second program operation in a control method for the unselected word lines WL during the precharge operation.

The above-described write operation will be described in detail using FIG. 6. FIG. 6 illustrates a flowchart of the write operation on one block BLK. In the description below, the selected select gate line SGD and the unselected select gate line SGD are referred to as the select gate line SGD_sel and the select gate line SGD_usel, respectively, and the selected word line WL and the unselected word line WL are referred to as the word line WL_sel and the word line WL_usel, respectively. The bit line BL corresponding to the write target memory cell is referred to as the bit line BL_prog, and each bit line BL corresponding to the write inhibited memory cell is referred to as the bit line BL_inh. Furthermore, in the following description, a variable i is used for simplification of the description. The variable i is, for example, a variable held by a counter provided in the sequencer 17 and is incremented under the control of the sequencer 17.

As illustrated in FIG. 6, first, the sequencer 17 resets the counter (i=0, step S10). Then, the sequencer 17 performs the first write operation with the word line WLi selected and the string units SU0 to SU3 sequentially selected (step S11).

Figure 7:
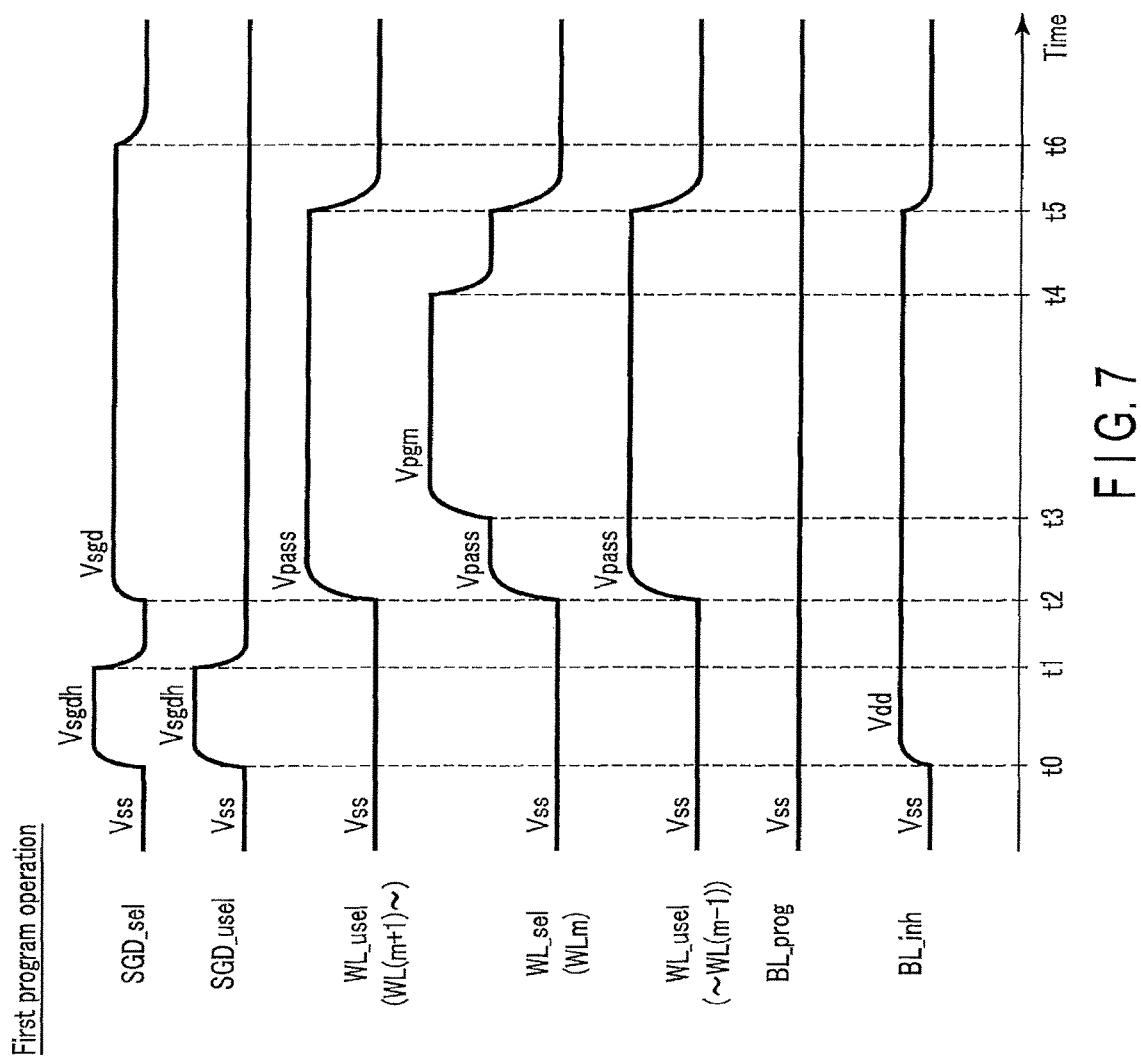
FIG. 7 is a waveform diagram of the write operation in the semiconductor memory device according to the first embodiment.

FIG. 7 illustrates a specific example of the first program operation performed during the first write operation. FIG. 7 depicts waveforms of the select gate lines SGD, the word lines WL, and the bit lines BL corresponding to the selected block BLK during the program operation, and illustrates an example where the mth (m is an integer of 1 or larger) word line of eight word lines WL is selected. FIG. 7 also illustrates a waveform of a set of the 0th to (m−1)th word lines and a waveform of a set of the (m+1)th to seventh word lines WL, with a waveform of the selected word line WLm between the two sets.

Now, the first program operation will be described in brief using FIG. 7. In the first program operation, the waveform of the set of the 0th to (m−1)th word lines, which are unselected, is similar to the waveform of the set of the (m+1)th to seventh word lines WL, which are also unselected. In other words, these unselected word lines WL_usel are similarly controlled and are thus hereinafter not distinguished from one another unselected word lines WL_usel.

As illustrated in FIG. 7, in an initial state before time t0, the row decoder 13 applies a voltage Vss to the select gate line SGD and the word line WL, and the sense amplifier module 12 applies the voltage Vss to the bit line BL.

At time t0, the row decoder 13 applies a voltage Vsgdh to the select gate lines SGD_sel and SGD_usel, and the sense amplifier module 12 applies the voltage Vdd to the bit line BL_inh. The voltage Vsgdh is a voltage higher than a threshold voltage of the select transistor ST1. When the voltage Vsgdh is applied to the select gate lines SGD_sel and SGD_usel, the corresponding select transistor ST1 is set to the on state to form a current path between each bit line BL and the corresponding NAND string NS. Then, the voltage Vdd is applied to the bit line BL_inh to increase the channel potential of the NAND string NS corresponding to the bit line BL_inh.

At time t1, the row decoder 13 applies the voltage Vss to the select gate lines SGD_sel and SGD_usel. When the voltage Vss is applied to the select gate lines SGD_sel and SGD_usel, the select transistor ST1 is set to an off state to bring a channel of the corresponding NAND string NS into a floating state. The channel potential of the NAND string brought into the floating state is maintained at a value increased by the voltage applied between time t0 and time t1. In other words, the channel potential of the NAND string NS corresponding to the bit line BL_inh is higher than the channel potential of the NAND string NS corresponding to the bit line BL_prog. The operation from time t0 to time t1 described above corresponds to the above-described precharge operation.

At time t2, the row decoder 13 applies a voltage Vsgd to the select gate line SGD_sel and applies a voltage Vpass to the word lines WL_sel and WL_usel. The voltage Vsgd is a voltage higher than the threshold voltage of the select transistor ST1 and lower than the voltage Vsgdh. The voltage Vpass is a voltage at which the memory cell transistor MT with the voltage Vpass applied the gate thereof is turned on regardless of the data held by the memory cell transistor MT. When the voltage Vsgd is applied to the select gate line SGD_sel and the voltage Vdd is applied to the bit line BL_inh, the select transistor ST1 is set to the off state to bring the channel of the NAND string NS into the floating state. Then, when the voltage Vpass is applied to the word lines WL_sel and WL_usel, the channel potential of the NAND string NS brought into the floating state increases as a result of coupling with the word lines WL (self-boost technique). On the other hand, the channel potential of the NAND string corresponding to the bit line BL_prog is maintained at the voltage Vss applied by the sense amplifier module 12.

At time t3, the row decoder 13 applies a voltage Vpgm to the word line WL_sel. When the voltage Vpgm is applied to the word line WL_sel, a difference in potential between the word line WL_sel and the channel of the NAND string NS corresponding to the bit line BL_prog causes electrons to be injected into the charge storage layer in the write target memory cell, increasing the threshold voltage of the memory cell. On the other hand, a difference in potential between the word line WL_sel and the channel of the NAND string NS corresponding to the bit line BL_inh is reduced by the self-boost, thus suppressing variation in the threshold voltage of the write inhibited memory cells.

At time t4, the row decoder 13 reduces the voltage applied to the word line WL_sel down to the voltage Vpass.

At time T5, the row decoder 13 reduces the voltage applied to the word lines WL_sel and WL_usel down to the voltage Vss, and the sense amplifier module 12 reduces the voltage applied to the bit line BL_inh down to the voltage Vss. Then, the channel potential of the NAND string NS bring into the floating state decreases consistently with the voltage of the word lines WL.

At time t6, the row decoder 13 reduces the voltage applied to the select gate line SGD_sel down to the voltage Vss. Then, the select transistor ST1 corresponding to the select gate line SGD_sel is set to the off state, resulting in a return to the initial state. The sequencer 17 ends the first program operation to shift to the verify operation.

As seen back in FIG. 6, when the first write operation with the word line WLi selected and the string units SU0 to SU3 sequentially selected ends, the variable i is incremented (i=i+1, step S12). The sequencer 17 then checks whether the variable i is equal to a numerical value k (step S13). The numerical value k may be set to any value and is set to 1 or more and 7 or less in the present example.

If the variable i is not equal to the numerical value k (step S13, NO), the sequencer 17 returns to step S11 to perform the first write operation on the next word line WL. If the variable i is equal to the numerical value k (step S13, YES), the sequencer 17 performs the second write operation with the word line WLi selected and the string units SU0 to SU3 sequentially selected (step S14).

Figure 8:
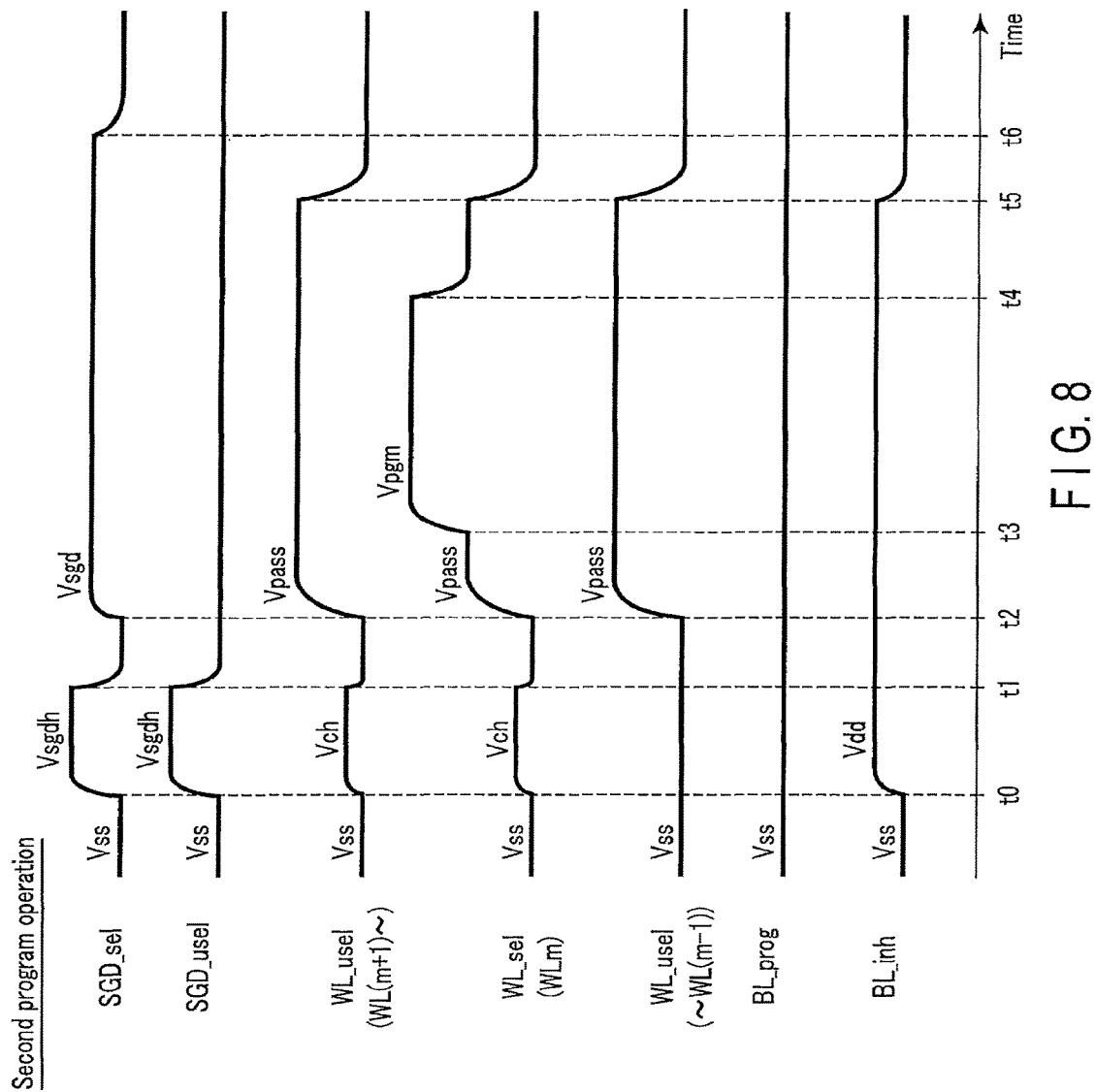
FIG. 8 is a waveform diagram of the write operation in the semiconductor memory device according to the first embodiment.

FIG. 8 illustrates a specific example of the second program operation performed during the second write operation. FIG. 8 depicts waveforms of the select gate lines SGD, the word lines WL, and the bit lines BL corresponding to the selected block BLK during the program operation, and illustrates an example where the mth word line of the eight word lines WL is selected. FIG. 8 also illustrates a waveform of a set of the 0th to (m−1)th word lines and a waveform of a set of the (m+1)th to seventh word lines WL, with a waveform of the selected word line WLm between the two sets.

Now, the second program operation will be described in detail using FIG. 8. As illustrated in FIG. 8, the second program operation is different from the first program operation, described using FIG. 7, in the operation of the selected word line WLm and the operation of the set of the (m+1)th to seventh word lines WL during the precharge operation.

Specifically, the row decoder 13 applies a voltage Vch to the mth word line WL_sel, which is selected, and to the set of the (m+1) to seventh word lines WL_usel, which are unselected. The voltage Vch is a voltage higher than the voltage Vss and lower than the voltage Vdd. When the voltage Vch is applied to the word lines WL, the memory cell transistors MT on which write has not been completed are more strongly turned on than when the voltage Vss is applied to the word lines WL. Then, the channel potential of the corresponding NAND string NS is higher than when the voltage Vss is applied to the word lines WL. At time t1, the row decoder 13 applies the voltage Vss to the mth word line WL_sel, which is selected, and to the set of the (m+1) to seventh word lines WL_usel, which are unselected. The remaining detailed portions of the second program operation are similar to the corresponding portions of the first program operation, and thus, description thereof is omitted.

As seen back in FIG. 6, when the second write operation with the word line WLi selected and the string units SU0 to SU3 sequentially selected ends, the sequencer 17 checks whether the last word line WL (for example, the word line WL7) has been selected, based on the variable i.

If the last word line WL in the block BLK has not been selected (step S15, NO), the sequencer 17 increments the variable i (i=i+1, step S16) and returns to step S14 to perform the second write operation on the next word line WL. If the last word line WL in the block BLK has been selected (step S15, YES), the sequencer 17 ends the write operation on the block BLK.

In the above description, the numerical value k in step S13 and the numerical value compared with the variable i by the sequencer 17 in step S15 are not limited to the above-described values. For example, if the number of the word lines WL provided in each block BLK is larger than that in the configuration illustrated above, these numerical values may be set to 8 or larger based on the number of the word lines WL.

[1-3] Effects of the First Embodiment

The above-described semiconductor memory device 10 according to the present embodiment allows reliability of the write operation to be improved. This effect will be described below in detail.

During the write operation of the semiconductor memory device, the precharge operation may be performed before the channel potential of the NAND string corresponding to the write inhibited memory cells is increased by the self-boost. In the precharge operation, the sense amplifier module applies a voltage to a write inhibited bit line to increase the channel potential of the NAND string corresponding to the bit line. Consequently, the channel potential reached by the self-boost can be increased, allowing suppression of an increase in the threshold voltage of the write inhibited memory cells. Moreover, in the precharge operation, when a voltage higher than the ground voltage is applied to the selected and unselected word lines corresponding to the block, the amount of increase in the channel potential of the corresponding NAND string can be increased.

However, when the voltage higher than the ground voltage is applied to the word lines during the precharge operation, the channel potential of the NAND string may decrease consistently with the voltage of each word line at the end of the precharge operation. This phenomenon is caused by the coupling between the channel of the NAND string and the word lines, and the amount of variation in channel potential varies, for example, based on the number of word lines to which the voltage higher than the ground voltage is applied. Such an increase in the amount of variation in the channel potential of the NAND string may reduce the suppression effect on an increase in the threshold voltage of the write inhibited memory cells resulting from the precharge operation, and may further cause program disturbance.

Thus, the semiconductor memory device 10 according to the present embodiment changes, for each block BLK, the precharge method for the program operation with each word line WL selected in such a manner that the precharge method used before the selection of the particular word line WL is different from the precharge method used after the selection. Specifically, the sequencer 17 performs the precharge operation of applying the voltage Vss to the selected word line WL and to the unselected word lines WL_usel during the program operation before the selection of the particular word line WL (first program operation), and performs the precharge operation of applying the voltage Vch, which is higher than the voltage Vss, to the selected word line WL_sel and to the unselected word lines WL_usel on which write to the corresponding memory cell has not been completed, during the program operation after the selection of the particular word line WL.

In other words, in the first program operation, the precharge operation is performed which inhibits possible variation in the channel potential of the NAND string NS caused by the coupling with the word lines WL. In the second program operation, the precharge operation is performed in which the number of the word lines WL to which the voltage Vch is applied is kept small to reduce the amount of variation in the channel potential of the NAND string NS caused by the coupling with the word lines WL.

Therefore, during the precharge operation in the second program operation, the voltage Vch is applied to the memory cells between the memory cell corresponding to the selected word line WL_sel and the select transistor ST1, facilitating a flow of a current between the bit line BL and the memory cell corresponding to the selected word line WL_sel to improve precharge efficiency.

For the particular word line WL designated for each block, the number of the word lines WL corresponding to the memory cells on which write has not been completed decreases, allowing designation of the word line for which the effect of a decrease in channel potential caused by the coupling is negligible after the precharge operation with the voltage Vch applied to the predetermined word lines.

Consequently, the amount of increase in the channel potential of the NAND string NS corresponding to the write inhibited memory cells can be made larger in the second program operation than in the first program operation. In other words, the channel potential reached by the self-boost is higher in the second program operation than in the first program operation. As a result, the second program operation can exert a higher suppression effect on an increase in the threshold voltage of the write inhibited memory cells by means of the precharge operation and the self-boost than the first program operation.

As described above, the semiconductor memory device 10 according to the present embodiment enables suppression of the adverse effect of program disturbance in the program operation after the selection of the particular word line WL during the write operation on each block BLK. Therefore, the semiconductor memory device 10 according to the present embodiment allows the reliability of written data to be improved in the write operation after the selection of the particular word line WL.

The precharge operation of applying the voltage higher than the ground voltage to the word lines WL as described above is particularly effective when the precharge operation is applied if, in the semiconductor memory device 10 with the memory cells three-dimensionally stacked therein, the word line WL corresponding to the uppermost layer is selected. Thus, during the write operation for each block BLK, the semiconductor memory device 10 may designate the word line WL corresponding to the uppermost layer of the block BLK (for example, the word line WL7) as a trigger for switching from the first program operation to the second program operation. In this case, the control performed by the sequencer 17 is simplified and power consumption of the write operation can be reduced.

[2] Second Embodiment

Now, the semiconductor memory device 10 according to a second embodiment will be described. In the present embodiment, the write operation described in the first embodiment is performed on the semiconductor memory device 10 in which the memory cell array 11 is provided with dummy transistors and a dummy word line.

[2-1] Configuration of the Memory Cell Array 11

Now, a circuit configuration of the semiconductor memory device 10 will be described using FIG. 9. FIG. 9 is a circuit diagram of the memory cell array 11 according to the present embodiment, illustrating a detailed circuit configuration for one block BLK in the memory cell array 11. As illustrated in FIG. 9, the circuit configuration of the memory cell array 11 according to the present embodiment is different from the circuit configuration described in the first embodiment using FIG. 2 in that the circuit configuration according to the present embodiment includes dummy transistors DT and a dummy word line DWL.

The dummy transistor DT is provided in each NAND string NS and connected between and in series with the memory cell transistor MT7 and the select transistor ST1. Specifically, a drain of the dummy transistor DT is connected to the source of the select transistor ST1, and a source of the dummy transistor DT is connected to the drain of the transistor MT7. Control gates of the dummy transistors DT in the same block BLK are connected commonly to the dummy word line DWL.

Like the memory cell transistors MT, each of the dummy transistors DT includes the control gate and a charge storage layer. However, the dummy transistor DT does not hold data and functions only as a current path during data write, read, and erase. The threshold voltage of the dummy transistor DT is, for example, included in the threshold distribution of the "ER" level. The remaining portions of the circuit configuration of the memory cell array 11 according to the present embodiment are similar to the corresponding portions of the circuit configuration described in the first embodiment using FIG. 2, and thus, description thereof is omitted.

Now, a cross-sectional structure of the memory cell array 11 will be described using FIG. 10. FIG. 10 illustrates a cross-sectional view of the memory cell array 11, and the X axis, the Y axis, and the Z axis intersecting one another. In FIG. 10, illustration of interlayer dielectrics is omitted. As illustrated in FIG. 10, the cross-sectional configuration of the memory cell array 11 according to the present embodiment is different from the cross-sectional configuration described in the first embodiment using FIG. 4 in that the memory cell array 11 according to the present embodiment is provided with an interconnect layer 33.

The interconnect layer 33 is formed between the set of the interconnect layers 22 and the set of the interconnect layers 23 to function as the dummy word line DWL. The plurality of semiconductor pillars MH extends through the interconnect layer 33 along the Z direction as is the case with the interconnect layers 22. An area where the interconnect layer 33 contacts each of the semiconductor pillars MH functions as the dummy transistor DT. The remaining portions of the circuit configuration of the memory cell array 11 according to the present embodiment are similar to the corresponding portions of the circuit configuration described in the first embodiment using FIG. 4, and thus, description thereof is omitted.

[2-2] Write Operation of the Semiconductor Memory Device

Now, the write operation of the semiconductor memory device 10 will be described. As in the case of the first embodiment, the semiconductor memory device 10 according to the present embodiment performs the first program operation during the write operation before the selection of the particular word line WL and performs the second program operation during the write operation after the selection of the particular word line WL.

Figure 11:
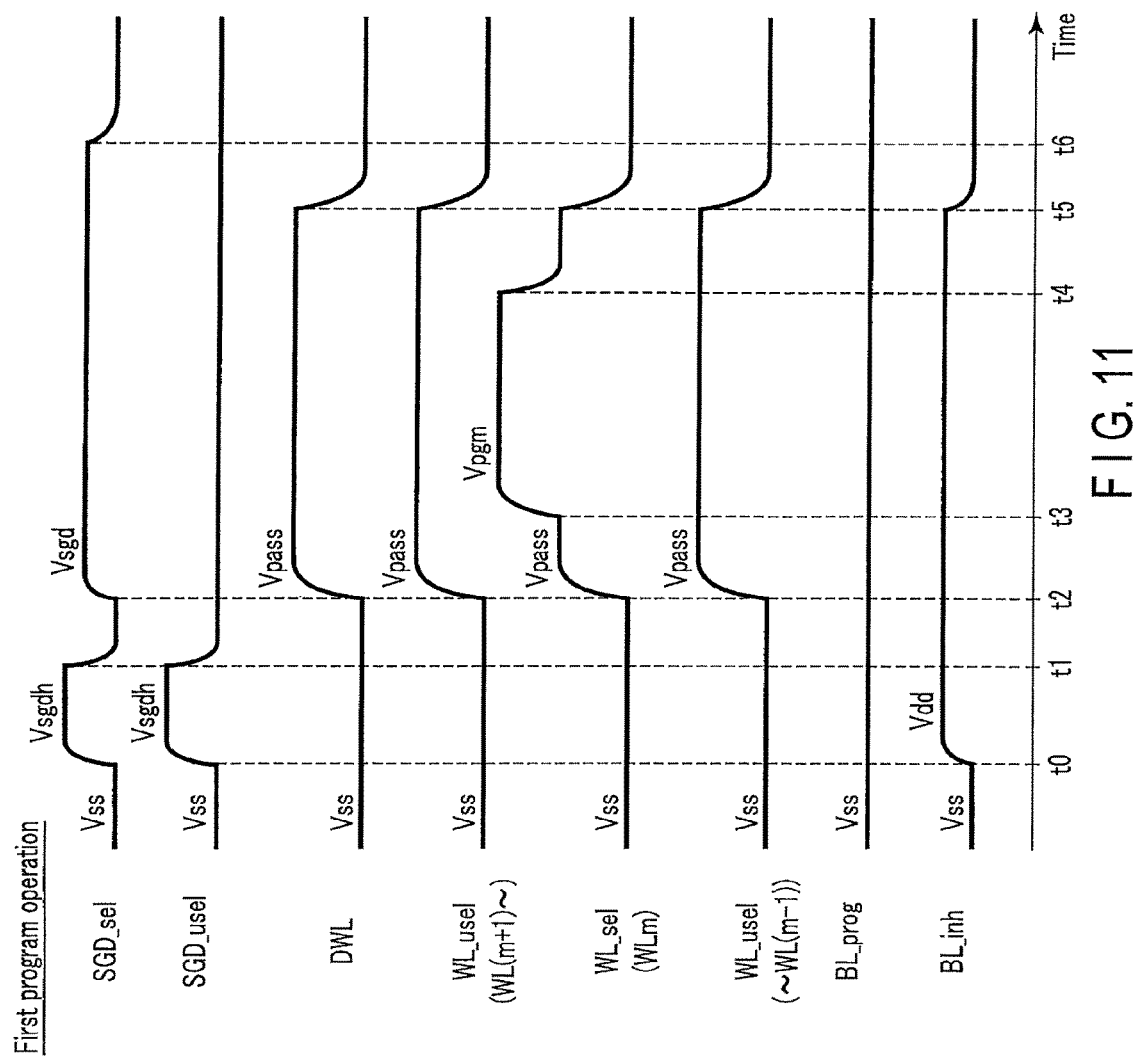
FIG. 11 is a waveform diagram of a write operation in the semiconductor memory device according to the second embodiment.

Specific examples of the first and second program operations according to the present embodiment will be described using FIG. 11 and FIG. 12. FIG. 11 illustrates specific examples of waveforms during the first program operation, and FIG. 12 illustrates specific examples of waveforms during the second program operation.

As illustrated in FIG. 11, the first program operation according to the present embodiment is different from the first program operation described in the first embodiment using FIG. 7 in an additional waveform of the dummy word line DWL. As illustrated in FIG. 11, the waveform of the dummy word line DWL is similar to the waveform of the unselected word lines WL_usel, and the dummy word line DWL and the unselected word lines WL_usel are similarly controlled. The remaining portions of the first program operation are similar to the corresponding portions of the first program operation described in the first embodiment, and thus, description thereof is omitted.

As illustrated in FIG. 12, the second program operation according to the present embodiment is different from the second program operation described in the first embodiment using FIG. 8 in an additional waveform of the dummy word line DWL. As illustrated in FIG. 12, the waveform of the dummy word line DWL is similar to the waveform of the (n+1)th to seventh word lines WL_usel, and the dummy word line DWL and the (n+1)th to seventh word lines WL_usel are similarly controlled. The remaining portions of the second program operation are similar to the corresponding portions of the second program operation described in the first embodiment, and thus, description thereof is omitted.

[2-3] Effects of the Second Embodiment

As described above, the semiconductor memory device 10 according to the present embodiment allows a write operation similar to that in the first embodiment to be performed by driving the dummy word line DWL as is the case with the unselected word lines WL_usel on which write has not been completed. Therefore, the semiconductor memory device 10 according to the present embodiment allows the reliability of written data to be improved in the write operation after the selection of the particular word line WL.

The semiconductor memory device 10 according to the present embodiment has been described taking, as an example, the case where the dummy word line DWL is operated similarly to the unselected word lines WL_usel on which write has not been completed. However, the present invention is not limited to this. For example, different voltages may be applied to the dummy word line DWL and to the unselected word lines WL_usel on which write has not been completed. In such a case, similar effects can be produced by applying the ground voltage to the dummy word line DWL during the precharge operation in the first program operation and applying a voltage higher than the ground voltage to the dummy word line DWL during the precharge operation in the second program operation.

[3] Modifications and the Like

The semiconductor memory device 10 according to the above-described embodiments comprises the first and second memory cell transistors <MT, FIG. 2>, the bit line <BL, FIG. 2>, the first and second word lines <WL, FIG. 2>, the select gate line <SGD, FIG. 2>, and the controller. The first end of the first memory cell is connected to the first end of the second memory cell transistor. The second end of the second memory cell transistor is connected to the first end of the select transistor. The second end of the select transistor is connected to the bit line. The first and second word lines are connected to the gates of the first and second memory cell transistors, respectively. The select gate line is connected to the gate of the select transistor. The controller performs the write operation. In the write operation, the controller performs the program loop including the program operation of applying a program pulse to the selected word line. During the program operation <first program operation, FIG. 7> in the write operation with the first word line selected, the controller applies the first voltage <Vsgdh> to the select gate line and the second voltage <Vss> lower than the first voltage to the first word line before applying the program pulse to the first word line, and applies the third voltage <Vsgd> lower than the first voltage and higher than the second voltage to the select gate line while applying the program pulse to the first word line. During the program operation <second program operation, FIG. 8> in the write operation with the second word line selected, the controller applies the first voltage to the select gate line and the fourth voltage <Vch> higher than the second voltage to the second word line before applying the program pulse to the second word line, and applies the third voltage to the select gate line while applying the program pulse to the second word line. Consequently, a semiconductor memory device can be provided which enables the reliability of the write operation to be improved.

In the above-described embodiments, by way of example, the program operation performed before the selection of the particular word line WL is switched to a different program operation performed after the selection of the particular word line WL. However, the present invention is not limited to this. For example, when the threshold voltage of the memory cell is increased up to the desired voltage by a two-step write operation, the adjacent word lines WL need to be alternately selected. For example, the sequencer 17 may perform control in such a manner that, in the write operation for each block BLK, the second program operation starts to be performed during the first write operation with the particular word line WL selected or during the second write operation with the particular word line WL selected. Even in such a case, effects similar to those of the above-described embodiments can be produced.

In the write operation in the above-described embodiments, 2-bit data is stored in one memory cell, by way of example. However, the present invention is not limited to this. For example, data of one bit or three or more bits may be stored in one memory cell.

The second embodiment has been described taking, as an example, the case where the dummy transistor DT is provided between the select transistor ST1 and the memory cell transistor MT7. However, the present invention is not limited to this. For example, the dummy transistor DT may be provided between the memory cell transistor MT0 and the select transistor ST2. Alternatively, two or more dummy transistors DT may be provided between each select transistor and the set of the series connected memory cell transistors MT.

In the above-described embodiments, the memory cell array 11 may not be configured in such a manner that the memory cells are three-dimensionally stacked above the semiconductor substrate. In other words, the memory cell array 11 in the semiconductor memory device 10 may be configured in such a manner that the memory cells are two-dimensionally arrayed on the semiconductor substrate.

The "connection" as used herein refers to electric connection and does not exclude, for example, the intervention, between elements, of another element.

In the embodiments according to the present invention:

(1) The voltage applied to the word line selected for the read operation at the "A"-level may be, for example, 0 V to 0.55 V. The voltage is not limited thereto, and may be 0.1 V to 0.24 V, 0.21 V to 0.31 V, 0.31 V to 0.4 V, 0.4 V to 0.5 V, or 0.5 V to 0.55 V.

The voltage applied to the word line selected for the read operation at the "B"-level is, for example, 1.5 V to 2.3 V. The voltage is not limited thereto, and may be 1.65 V to 1.8 V, 1.8 V to 1.95 V, 1.95 V to 2.1 V, or 2.1 V to 2.3 V.

The voltage applied to the word line selected for the read operation at the "C"-level is, for example, 3.0 V to 4.0 V. The voltage is not limited thereto, and may be 3.0 V to 3.2 V, 3.2 V to 3.4 V, 3.4 V to 3.5 V, 3.5 V to 3.6 V, or 3.6 V to 4.0 V.

The time (tR) for the read operation may be, for example, 25 μs to 38 μs, 38 μs to 70 μs, or 70 μs to 80 μs.

(2) The write operation includes the program operation and the verification operation as described above. In the write operation, the voltage first applied to the word line selected for the program operation may be, for example, 13.7 V to 14.3 V. The voltage is not limited thereto, and may be 13.7 V to 14.0 V or 14.0 V to 14.6 V.

The voltage first applied to the selected word line in the writing into an odd word line, and the voltage first applied to the selected word line in the writing into an even word line may be changed.

When the program operation is an incremental step pulse program (ISPP) type, a step-up voltage is, for example, about 0.5.

The voltage applied to the unselected word line may be, for example, 6.0 V to 7.3 V. The voltage is not limited thereto, and may be, for example, 7.3 V to 8.4 V or may be 6.0 V or less.

The pass voltage to be applied may be changed depending on whether the unselected word line is an odd word line or an even word line.

The time (tProg) for the write operation may be, for example, 1700 μs to 1800 μs, 1800 μs to 1900 μs, or 1900 μs to 2000 μs.

(3) In the erase operation, the voltage first applied to a well which is formed on the semiconductor substrate and over which the memory cells are arranged may be, for example, 12 V to 13.6 V. The voltage is not limited thereto, and may be, for example, 13.6 V to 14.8 V, 14.8 V to 19.0 V, 19.0 to 19.8 V, 19.8 V to 21 V.

The time (tErase) for the erase operation may be, for example, 3000 μs to 4000 μs, 4000 μs to 5000 μs, or 4000 μs to 9000 μs.

(4) The structure of the memory cell may have the charge storage layer disposed on the semiconductor substrate (silicon substrate) via a tunnel insulating film having a thickness of 4 to 10 nm. This charge storage layer may have a stacked structure including an insulating film of SiN or SiON having a thickness of 2 to 3 nm and polysilicon having a thickness of 3 to 8 nm. A metal such as Ru may be added to polysilicon. An insulating film is provided on the charge storage layer. This insulating film has, for example, a silicon oxide film having a thickness of 4 to 10 nm intervening between a lower high-k film having a thickness of 3 to 10 nm and an upper high-k film having a thickness of 3 to 10 nm. The high-k film includes, for example, HfO. The silicon oxide film can be greater in thickness than the high-k film. A control electrode having a thickness of 30 to 70 nm is formed on the insulating film via a material for work function adjustment having a thickness of 3 to 10 nm. Here, the material for work function adjustment includes a metal oxide film such as TaO or a metal nitride film such as TaN. W, for example, can be used for the control electrode.

An air gap can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory cell transistor;
a second memory cell transistor including a first end connected to a first end of the first memory cell transistor;
a select transistor including a first end connected to a second end of the second memory cell transistor;
a bit line connected to a second end of the select transistor;
a first word line connected to a gate of the first memory cell transistor;
a second word line connected to a gate of the second memory cell transistor;
a select gate line connected to a gate of the select transistor; and
a controller configured to perform a write operation, wherein
the controller is configured:
to perform a program loop including a program operation of applying a program pulse to a selected word line,
to apply, during the program operation in the write operation with the first word line selected,
a first voltage to the select gate line and a second voltage lower than the first voltage to the first word line before applying the program pulse to the first word line, and
a third voltage higher than the second voltage to the select gate line and a fifth voltage to the second word line while applying the program pulse to the first word line, and
to apply, during the program operation in the write operation with the second word line selected,
the first voltage to the select gate line and a fourth voltage higher than the second voltage and lower than the fifth voltage to the second word line before applying the program pulse to the second word line, and
the third voltage to the select gate line and the fifth voltage to the first word line while applying the program pulse to the second word line.

2. The device of claim 1, wherein
the write operation with the second word line selected is performed after the write operation with the first word line selected.

3. The device of claim 1, further comprising:
a NAND string including a plurality of memory cell transistors connected together in series; and
a plurality of word lines connected to the plurality of memory cell transistors, respectively, wherein
the plurality of memory cell transistors includes the first and second memory cell transistors, and
the controller is configured to apply, in the program operation before selection of the second word line, the first voltage to the select gate line and the second voltage to the plurality of word lines before applying the program pulse to the selected word line when consecutive write operations with the plurality of memory cell transistors in the NAND string selected are to be performed.

4. The device of claim 3, wherein
the controller is configured to apply, in the program operation after the selection of the second word line, the first voltage to the select gate line and the fourth voltage to those of the plurality of word lines on which write to the corresponding memory cell transistor has not been completed before applying the program pulse to the selected word line, when consecutive write operations are to be performed on the plurality of memory cell transistors in the NAND string.

5. The device of claim 4, wherein
the controller is configured to apply, in the program operation after the selection of the second word line, the second voltage to those of the plurality of word lines on which write to the corresponding memory cell transistor has been completed while applying the fourth voltage to those of the plurality of word lines on which write to the corresponding memory cell transistor has not been completed, when consecutive write operations are to be performed on the plurality of memory cell transistors in the NAND string.

6. The device of claim 1, further comprising:
a NAND string including a plurality of memory cell transistors connected together in series, the plurality of memory cell transistors including a first memory cell transistor and a second memory cell transistor;
a plurality of word lines connected to the plurality of memory cell transistors, respectively;
a dummy transistor connected between the second end of the second memory cell transistor and the first end of the select transistor; and
a dummy word line connected to a gate of the dummy transistor, wherein
the second end of the second memory cell transistor and the first end of the select transistor are connected together with no other memory cell transistor interposed therebetween, and
the controller is configured:
to apply, during the program operation in the write operation with the first word line selected, the second voltage to the dummy word line while applying the first voltage to the select gate line and applying the second voltage to the first word line,
to apply, during the program operation in the write operation with the second word line selected, the fourth voltage to the dummy word line while applying the first voltage to the select gate line and applying the fourth voltage to the second word line,
to apply, in the program operation before selection of the second word line, the first voltage to the select gate line and the second voltage to the plurality of word lines before applying the program pulse to the selected word line when consecutive write operations with the plurality of memory cell transistors in the NAND string selected are to be performed,
to apply, in the program operation after the selection of the second word line, the first voltage to the select gate line and the fourth voltage to those of the plurality of word lines on which write to the corresponding memory cell transistor has not been completed before applying the program pulse to the selected word line, when consecutive write operations are to be performed on the plurality of memory cell transistors in the NAND string, and
to apply, in the program operation after the selection of the second word line, the second voltage to those of the plurality of word lines on which write to the corresponding memory cell transistor has been completed while applying the fourth voltage to those of the plurality of word lines on which write to the corresponding memory cell transistor has not been completed, when consecutive write operations are to be performed on the plurality of memory cell transistors in the NAND string.

7. The device of claim 1, further comprising:
a first interconnect layer and a second interconnect layer stacked in order above a semiconductor substrate, wherein
the first and second interconnect layers function as the first and second word lines, respectively.

8. The device of claim 1, wherein
a second end of the first memory cell transistor is connected to a semiconductor substrate.

9. The device of claim 1, further comprising:
a third memory cell transistor including a first end connected to a second end of the first memory cell transistor; and
a third word line connected to a gate of the third memory cell transistor, wherein
the controller is configured:
to apply, during the program operation with the first word line selected, the second voltage to the third word line before applying the program pulse to the first word line, and
to apply, during the program operation with the second word line selected, the second voltage to the third word line before applying the program pulse to the second word line.

10. The device of claim 1, further comprising:
a fourth memory cell transistor connected between the second memory cell transistor and the select transistor; and
a fourth word line connected to a gate of the fourth memory cell transistor, wherein
the controller is configured:
to apply, during the program operation with the first word line selected, the second voltage to the fourth word line before applying the program pulse to the first word line, and
to apply, during the program operation with the second word line selected, the fourth voltage to the fourth word line before applying the program pulse to the second word line.

11. The device of claim 1, wherein
the first word line is adjacent to the second word line via an insulating layer.

12. A semiconductor memory device comprising:
a first memory cell transistor;
a second memory cell transistor including a first end connected to a first end of the first memory cell transistor;
a select transistor including a first end connected to a second end of the second memory cell transistor;
a bit line connected to a second end of the select transistor;
a first word line connected to a gate of the first memory cell transistor;
a second word line connected to a gate of the second memory cell transistor;
a select gate line connected to a gate of the select transistor; and
a controller configured to perform a write operation including a program operation and a precharge operation, wherein
the controller is configured:
to apply a program pulse to a selected word line in the program operation,
to apply, during the precharge operation in the write operation with the first word line selected, a first voltage to the select gate line and a second voltage lower than the first voltage to the first word line,
to apply, during the program operation in the write operation with the first word line selected, a fifth voltage to the second word line while applying the program pulse to the first word line,
to apply, during the precharge operation in the write operation with the second word line selected, the first voltage to the select gate line and a fourth voltage higher than the second voltage and lower than the fifth voltage to the second word line, and to apply, during the program operation in the write operation with the second word line selected, the fifth voltage to the first word line while applying the program pulse to the second word line.

13. The device of claim 12, wherein the controller is configured:

to apply, during the program operation in the write operation with the first word line selected, a third voltage lower than the first voltage to the select gate line while applying the program pulse to the first word line, and to apply, during the program operation in the write operation with the second word line selected, the third voltage to the select gate line while applying the program pulse to the second word line.

14. The device of claim 13, further comprising:

a NAND string including a plurality of memory cell transistors connected together in series; and a plurality of word lines connected to the plurality of memory cell transistors, respectively, wherein the plurality of memory cell transistors includes the first and second memory cell transistors, and the controller is configured to apply, in the program operation before selection of the second word line, the first voltage to the select gate line and the second voltage to the plurality of word lines before applying the program pulse to the selected word line when consecutive write operations with the plurality of memory cell transistors in the NAND string selected are to be performed.

15. The device of claim 14, wherein the controller is configured to apply, in the program operation after the selection of the second word line, the first voltage to the select gate line and the fourth voltage to those of the plurality of word lines on which write to the corresponding memory cell transistor has not been completed before applying the program pulse to the selected word line, when consecutive write operations are to be performed on the plurality of memory cell transistors in the NAND string.

16. The device of claim 15, wherein the controller is configured to apply, in the program operation after the selection of the second word line, the second voltage to those of the plurality of word lines on which write to the corresponding memory cell transistor has been completed while applying the fourth voltage to those of the plurality of word lines on which write to the corresponding memory cell transistor has not been completed, when consecutive write operations are to be performed on the plurality of memory cell transistors in the NAND string.

17. The device of claim 12, wherein a second end of the first memory cell transistor is connected to a semiconductor substrate.

18. The device of claim 12, further comprising:

a third memory cell transistor including a first end connected to a second end of the first memory cell transistor; and a third word line connected to a gate of the third memory cell transistor, wherein the controller is configured:

to apply, during the program operation with the first word line selected, the second voltage to the third word line before applying the program pulse to the first word line, and to apply, during the program operation with the second word line selected, the second voltage to the third word line before applying the program pulse to the second word line.

19. The device of claim 12, further comprising:

a fourth memory cell transistor connected between the second memory cell transistor and the select transistor; and a fourth word line connected to a gate of the fourth memory cell transistor, wherein the controller is configured:

to apply, during the program operation with the first word line selected, the second voltage to the fourth word line before applying the program pulse to the first word line, and to apply, during the program operation with the second word line selected, the fourth voltage to the fourth word line before applying the program pulse to the second word line.

20. The device of claim 12, wherein the first word line is adjacent to the second word line via an insulating layer.

* * * * *